United States Patent

Shim et al.

[11] Patent Number: 5,846,596
[45] Date of Patent: Dec. 8, 1998

[54] METHODS OF FORMING FIELD OXIDE ISOLATION REGIONS HAVING SLOPED EDGES

[75] Inventors: Myoung-seob Shim, Kyungki-do; Hun-chul Shin, Seoul, both of Rep. of Korea

[73] Assignee: Samsung Electronics Co., Ltd., Suwon, Rep. of Korea

[21] Appl. No.: 794,929

[22] Filed: Feb. 4, 1997

[30] Foreign Application Priority Data

Feb. 22, 1996 [KR] Rep. of Korea .................. 96-4201

[51] Int. Cl.⁶ .................. B05D 5/12; H01L 21/76
[52] U.S. Cl. .................. 427/96; 427/380; 427/419.3; 438/439; 438/452
[58] Field of Search .................. 438/439, 452; 427/96, 419.3, 387

[56] References Cited

U.S. PATENT DOCUMENTS

| | | | |
|---|---|---|---|
| 4,583,281 | 4/1986 | Ghezzo et al. | 438/439 |
| 4,729,816 | 3/1988 | Nguyen et al. | 438/439 |
| 4,758,530 | 7/1988 | Schubert | 439/452 |
| 4,863,562 | 9/1989 | Bryant et al. | 438/452 |

*Primary Examiner*—Brian K. Talbot
*Attorney, Agent, or Firm*—Myers Bigel Sibley & Sajovec

[57] ABSTRACT

Methods of forming field oxide isolation regions having sloped edges which facilitate uniform step coverage of subsequently patterned metallization, etc. but do not encroach upon semiconductor active regions, include the steps of patterning a first mask on a face of a semiconductor substrate to define an active region thereunder and then forming a pad insulation layer on the face of the substrate and in abutting relation to edges of the first mask. Oxidation resistant spacers are then formed on the edges of the first mask and on the pad insulation layer so that field oxide isolation regions having sloped edges can be formed by growing the pad insulation layer through oxidation so that it extends away from the edges of the first mask and does not undercut the first mask to form parasitic bird's beak oxide extensions. The inclusion of oxidation resistant spacers causes the subsequently formed field oxide isolation regions to have edges which are sloped at low angles of inclination in a direction away from the active region mask instead of being vertical.

13 Claims, 3 Drawing Sheets

METHODS OF FORMING FIELD OXIDE ISOLATION REGIONS HAVING SLOPED EDGES

FIELD OF THE INVENTION

The present invention relates to semiconductor fabrication methods, and more particularly to methods of forming field oxide isolation regions in semiconductor substrates.

BACKGROUND OF THE INVENTION

Device isolation techniques play an important role in the design and performance of highly integrated semiconductor circuits by electrically isolating regions and devices therein from adjacent devices and regions. Moreover, as the degree of integration in semiconductor circuits increases, there is a concomitant need to develop techniques for forming isolation regions which can be scaled to provide isolation regions having smaller dimensions, but without sacrificing the isolation capability of the regions.

One such conventional technique for forming isolation regions is a local oxidation of silicon (LOCOS) technique. However, this conventional technique may not always be suitable for applications requiring the formation of active devices having reduced lateral dimensions because it typically results in the formation of isolation regions having bird's beak oxide extensions and these extensions typically encroach upon the lateral area available for active device formation. To address this problem, many techniques have been proposed which result in the formation of field oxide isolation regions that are relatively free of bird's beak oxide extensions. One such technique is illustrated by FIGS. 1–4.

In particular, as illustrated by FIG. 1, a field oxide isolation region can be formed by initially forming a pad insulation layer 20 on a semiconductor substrate 10. Here, the pad insulation layer 20 is formed of silicon oxynitride ($SiO_xN_y$) to inhibit the formation of bird's beak oxide extensions. A oxidation resistant layer 30 is then formed on the pad insulation layer 20. As illustrated best by FIGS. 2–3, these layers are then etched to define a mask (regions 20a, 30a) which exposes a portion of the substrate 10 at a face thereof. The exposed portion of the face is then oxidized to form a field oxide isolation region 40 which is relatively free of bird's beak oxide extensions extending laterally therefrom. However, as illustrated best by FIG. 4, successful elimination of the oxide extensions may cause the field oxide isolation region 40 to have substantially vertical sidewalls with large angles θ of inclination. Unfortunately, as will be understood by those skilled in the art, the formation of isolation regions having substantially vertical sidewalls may limit the ability to obtain reliable step coverage during subsequent back-end processing steps such as metallization.

Thus, notwithstanding the above described technique, there continues to be a need for improved methods of forming field oxide isolation regions which are substantially free of bird's beak oxide extensions and are compatible with back-end processing steps.

SUMMARY OF THE INVENTION

It is therefore an object of the present invention to provide improved methods of forming field oxide isolation regions in semiconductor substrates.

It is another object of the present invention to provide methods of forming field oxide isolation regions with reduced susceptibility to parasitic bird's beak oxide extensions.

It is still another object of the present invention to provide methods of forming field oxide isolation regions having sloped edges which facilitate uniform and reliable step coverage during subsequent processing steps.

These and other objects, features and advantages of the present invention are provided by methods of forming field oxide isolation regions having sloped edges which facilitate uniform step coverage of subsequently patterned metallization, etc., but do not encroach upon semiconductor active regions having reduced lateral dimensions. In particular, methods of forming field oxide isolation regions according to the present invention include the steps of patterning a first mask on a face of a semiconductor substrate to define an active region thereunder and then forming a pad insulation layer on the face of the substrate and in abutting relation to edges of the first mask. Oxidation resistant spacers are then formed on the edges of the first mask and on the pad insulation layer so that field oxide isolation regions having sloped edges can be formed by growing the pad insulation layer through oxidation so that it extends away from the edges of the first mask and does not undercut the first mask to form parasitic bird's beak oxide extensions.

According to one embodiment of the present invention, a first pad insulation layer comprising a material selected from the group consisting of silicon dioxide ($SiO_2$) and silicon oxynitride ($SiO_xN_y$) is formed on a face of a semiconductor substrate. Then, a first oxidation resistant layer, comprising a material selected from the group consisting of silicon oxynitride ($SiO_xN_y$) and silicon nitride ($Si_3N_4$), is formed on the first pad insulation layer, opposite the face of the semiconductor substrate. The first pad insulation layer and first oxidation resistant layer are then etched to expose the face of the semiconductor substrate and define an active region mask having first and second opposing edges. A second pad insulation layer, comprising a material selected from the group consisting of silicon dioxide and silicon oxynitride, is then formed on the face, adjacent the first and second opposing edges of the active region mask. To preclude the formation of parasitic bird's beak oxide extensions underneath the active region mask which may limit the lateral areas available for the formation of active devices therein, oxidation resistant spacers are formed on the first and second opposing edges of the active region mask. Then, portions of the substrate extending opposite the second pad insulation layer are oxidized, using the oxidation resistant spacers as an oxidation mask, to form field oxide isolation regions. The inclusion of oxidation resistant spacers causes the subsequently formed field oxide isolation regions to have edges which are sloped in a direction away from the active region mask instead of being vertical.

DESCRIPTION OF PREFERRED EMBODIMENTS

Figure 1:
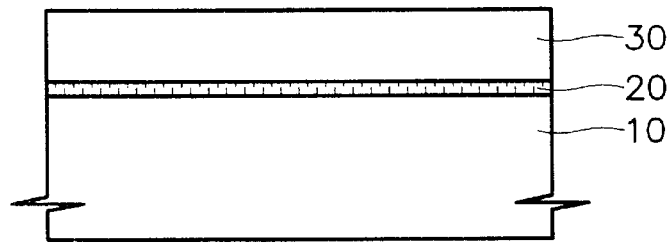
FIGS. 1–4 are schematic cross-sectional views of intermediate structures which illustrate a method of forming field oxide isolation regions according to the prior art.
Figure 2:
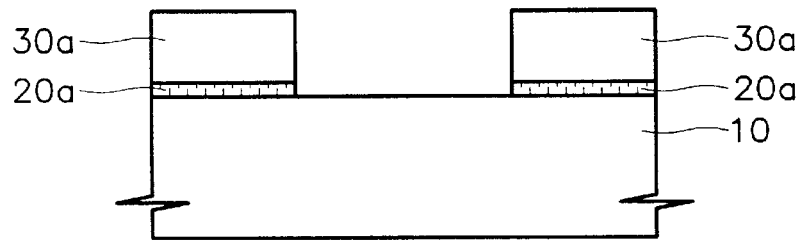
Figure 3:
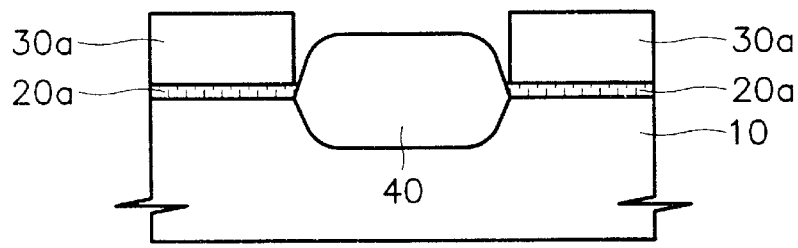
Figure 4:
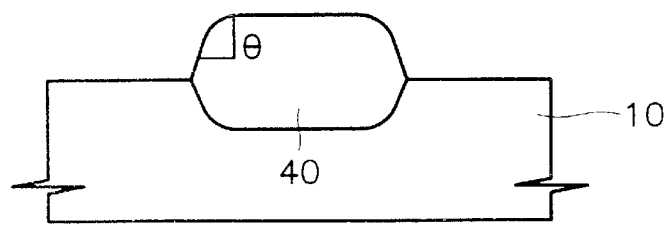

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 5:
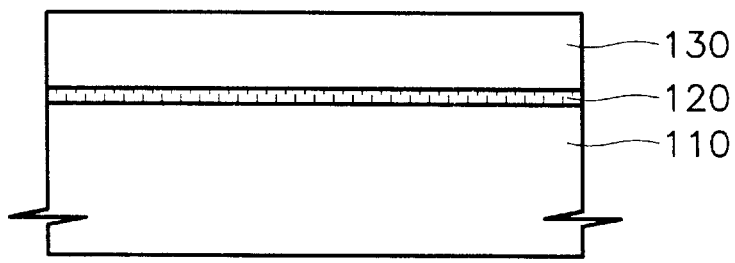
FIGS. 5–11 are schematic cross-sectional views of intermediate structures which illustrate a method of forming field oxide isolation regions according to an embodiment of the present invention.
Figure 6:
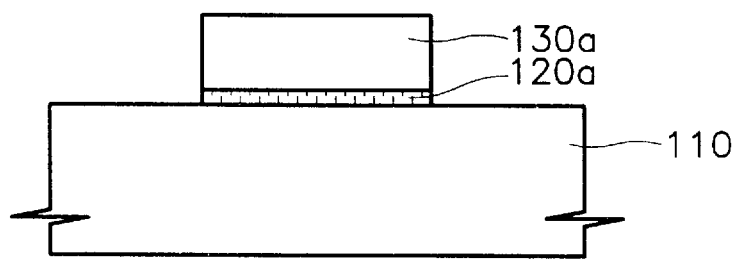

Referring now to FIGS. 5–11, a preferred method of forming field oxide isolation regions will be described. In particular, FIG. 5 illustrates the steps of forming a first pad insulation layer 120 on a face of a semiconductor substrate 110. The first pad insulation layer 120 is preferably formed of a material selected from the group consisting of silicon dioxide ($SiO_2$) and silicon oxynitride ($SiO_xN_y$) and may have a thickness of about 70–100 Å. After formation of the first pad insulation layer 120, a first oxidation resistant layer 130 is formed on the first pad insulation layer 120, as illustrated. The first oxidation resistant layer 130 preferably comprises a material selected from the group consisting of silicon oxynitride or silicon nitride ($Si_3N_4$). As illustrated best by FIG. 6, the first oxidation resistant layer 130 and first pad insulation layer 120 are then preferably patterned using conventional photolithography and etching techniques, to define a first active region mask having opposing edges (e.g., sidewalls). Here, the active region mask comprises regions 120a and 130a. As described further herein, the active region mask defines an active region in the substrate 110 wherein active electronic devices are to be formed. The active region mask also exposes portions of the substrate which are subsequently oxidized to form field oxide isolation regions which extend between adjacent active regions, for example.

Figure 7:
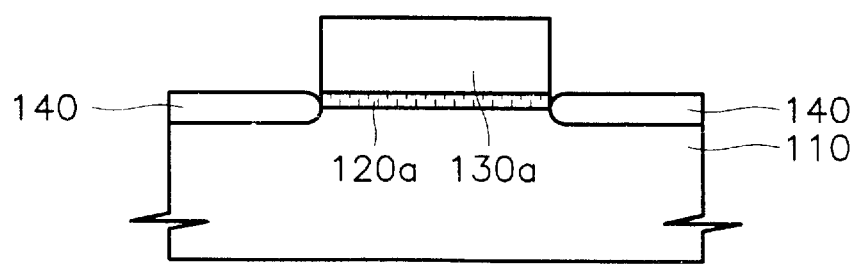
Figure 8:
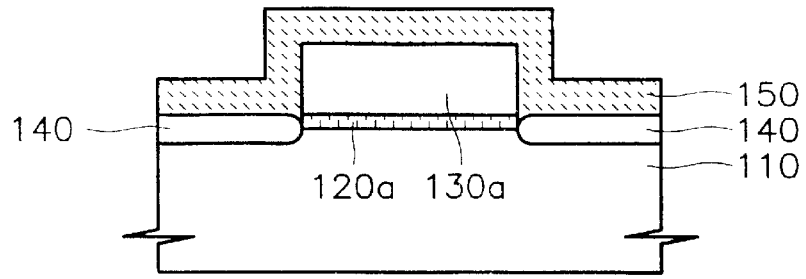

Referring now to FIG. 7, a second pad insulation layer 140 is preferably formed on the exposed portions of the face of the substrate 110. Like the first pad insulation layer 120, the second pad insulation layer 140 may comprise a material selected from the group consisting of silicon dioxide or silicon oxynitride and may be formed using a thermal oxidation technique. Preferably, the second pad insulation layer 140 is formed to have a thickness greater than the thickness of the first pad insulation layer (e.g., 160 Å). The inclusion of nitrogen in the first pad insulation layer 120 and first oxidation resistant layer 130 may also be used to inhibit the formation of bird's beak oxide extensions between the active region mask and substrate, as described more fully in commonly assigned U.S. Pat. No. 5,447,885 to Cho et al., the disclosure of which is hereby incorporated herein by reference. Referring now to FIG. 8, a second oxidation resistant layer 150 is preferably formed on the active region mask and on the second pad insulation layer 140, as illustrated. The second oxidation resistant layer 150 may also comprise a material selected from the group consisting of silicon oxynitride and silicon nitride and may be formed to have a thickness of about 200 Å.

Figure 9:
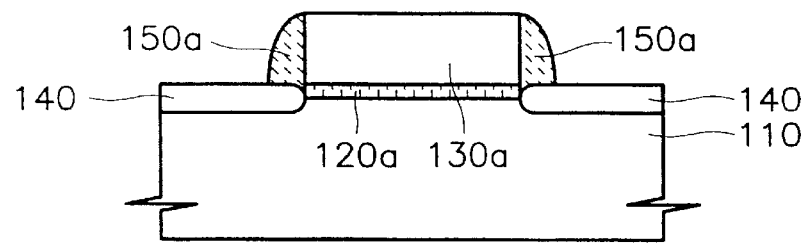
Figure 10:
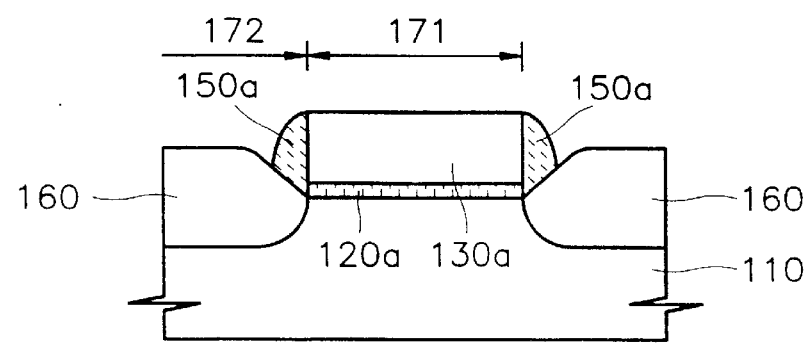

Referring now to FIG. 9, the second oxidation resistant layer 150 is then anisotropically etched to define oxidation resistant spacers 150a on opposing edges or sidewalls of the active region mask. Then, as illustrated by FIG. 10, the second pad insulation layer 140 is grown into field oxide isolation regions 160 having thicknesses of about 3500 Å, using a wet oxidation technique which oxidizes portions of the substrate extending opposite the second pad insulation layer 140. Here, the oxidation resistant spacers 150a force the growth of the second pad insulation layer 140 away from the sidewalls of the active region mask so that the resulting field oxide isolation regions 160 have sloped (i.e., graded) sidewalls. These sloped sidewalls facilitate uniform step coverage of subsequently patterned metallization, etc., but do not encroach upon the semiconductor active region disposed opposite the active region mask. Thus, the inactive portion 172 of the substrate defined by the field oxide isolation regions 160 does not encroach upon the active portion 171.

Figure 11:
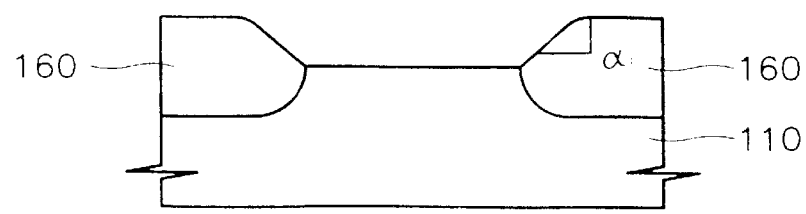

Referring now to FIG. 11, the active region mask is removed to expose an active region in the substrate 110. The active region has lateral dimensions defined by the resulting field oxide isolation regions 160. Here, the degree of inclination ($\alpha$) at the edges of the field oxide isolation regions 160 is maintained at a low value by using the oxidation resistant spacers 150a. This reduced angle of inclination improves step coverage and increases process yield.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a field oxide isolation region, comprising the steps of:

patterning a first mask on a face of a semiconductor substrate to define an active region thereunder;

forming an oxygen-containing electrical insulation layer in contact with the face of the substrate and in abutting relation to an edge of the first mask;

forming an oxidation resistant spacer on the edge of the first mask and on the electrical insulation layer; and oxidizing a portion of the substrate extending opposite the electrical insulation layer to form a field oxide isolation region containing the electrical insulation layer, using the oxidation resistant spacer as an oxidation mask.

2. The method of claim 1, wherein said step of patterning a first mask comprises the steps of:

forming a first layer containing a material selected from the group consisting of silicon dioxide and silicon oxynitride, on the face of the substrate;

forming a second layer containing a material selected from the group consisting of silicon oxynitride and silicon nitride, on the first layer, opposite the face of the substrate; and etching the first and second layers to define the first mask.

3. The method of claim 2, wherein said first layer forming step comprises forming a first layer having a thickness in a range between about 70 Å and 100 Å on the face of the substrate; and wherein said second layer forming step comprises forming a second layer having a thickness greater than about 200 Å on the first layer.

4. The method of claim 2, wherein said step of forming an oxygen-containing electrical insulation layer comprises thermally oxidizing the face of the substrate, using the first mask as an oxidation mask.

5. The method of claim 4, wherein said step of forming an oxidation resistant spacer comprises forming an oxidation resistant layer containing a material selected from the group consisting of silicon oxynitride or silicon nitride on upper surfaces of the electrical insulation layer and the first mask and then anisotropically etching the oxidation resistant layer to define oxidation resistant spacers on respective opposite edges of the first mask.

6. The method of claim 5, wherein said oxidizing step comprises oxidizing the portion of the substrate extending opposite the pad insulation layer to form a field oxide isolation region having a thickness greater than about 3000 Å.

7. The method of claim 2, wherein said step of forming an oxygen-containing electrical insulation layer comprises forming an electrical insulation layer containing a material selected from the group consisting of silicon dioxide and silicon oxynitride and having a thickness greater than a thickness of the first layer.

8. The method of claim 3, wherein said step of forming an oxygen-containing electrical insulation layer comprises forming an electrical insulation layer containing a material selected from the group consisting of silicon dioxide and silicon oxynitride and having a thickness greater than a thickness of the first layer.

9. A method of forming a field oxide isolation region, comprising the steps of:

forming a first pad insulation layer comprising a material selected from the group consisting of silicon dioxide and silicon oxynitride, on a face of a semiconductor substrate;

forming a first oxidation resistant layer comprising a material selected from the group consisting of silicon oxynitride and silicon nitride, on the first pad insulation layer, opposite the face of the semiconductor substrate;

etching the first pad insulation layer and first oxidation resistant layer to expose the face of the semiconductor substrate and define an active region mask having first and second opposing edges;

forming an electrical insulation layer comprising a material selected from the group consisting of silicon dioxide and silicon oxynitride, in contact with the face, adjacent the first and second opposing edges of the active region mask;

forming oxidation resistant spacers comprising a material selected from the group consisting of silicon oxynitride and silicon nitride, on the first and second opposing edges of the active region mask; and oxidizing portions of the substrate extending opposite the electrical insulation layer to form a field oxide isolation region containing the electrical insulation layer, using the oxidation resistant spacers as an oxidation mask.

10. The method of claim 9, wherein said step of forming a first pad insulation layer comprises forming a first pad insulation layer having a thickness in a range between about 70 Å and 100 Å; and wherein said step of forming an electrical insulation layer comprises forming an electrical insulation layer having a thickness greater than the thickness of the first pad insulation layer.

11. The method of claim 10, wherein said step of forming a first oxidation resistant layer comprises forming a first oxidation resistant layer having a thickness greater than about 200 Å.

12. The method of claim 11, wherein said step of forming oxidation resistant spacers comprises the steps of forming a second oxidation resistant layer of a material selected from the group consisting of silicon oxynitride and silicon nitride on the active region mask and the electrical insulation layer and then anisotropically etching the second oxidation resistant layer to define the oxidation resistant spacers.

13. The method of claim 12, wherein said step of oxidizing portions of the substrate extending opposite the electrical insulation layer comprises oxidizing the substrate to expand the electrical insulation layer to a thickness greater than about 3000 Å.

* * * * *